(12) United States Patent
Chua et al.

(10) Patent No.: US 9,673,111 B2
(45) Date of Patent: Jun. 6, 2017

(54) METHODS FOR EXTREME ULTRAVIOLET MASK DEFECT MITIGATION BY MULTI-PATTERNING

(71) Applicant: GLOBALFOUNDRIES Singapore Pte. Ltd., Singapore (SG)

(72) Inventors: Gek Soon Chua, Singapore (SG); Tan Soon Yoeng, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/014,211

(22) Filed: Feb. 3, 2016

(65) Prior Publication Data
US 2016/0148848 A1 May 26, 2016

Related U.S. Application Data

(62) Division of application No. 14/253,658, filed on Apr. 15, 2014, now Pat. No. 9,257,277.

(51) Int. Cl.
| | |
|---|---|
| *H01L 21/302* | (2006.01) |
| *H01L 21/66* | (2006.01) |
| *H01L 21/027* | (2006.01) |
| *G03F 1/84* | (2012.01) |
| *H01L 27/02* | (2006.01) |
| *H01L 21/3213* | (2006.01) |

(52) U.S. Cl.
CPC ................ *H01L 22/12* (2013.01); *G03F 1/84* (2013.01); *H01L 21/0274* (2013.01); *H01L 21/32139* (2013.01); *H01L 27/0203* (2013.01)

(58) Field of Classification Search
CPC ..... G03F 1/24; G03F 1/72; G03F 1/36; H01L 21/32139
See application file for complete search history.

(56) References Cited

U.S. PATENT DOCUMENTS

| | | | |
|---|---|---|---|
| 6,589,709 B1 * | 7/2003 | Okoroanyanwu | H01L 21/28123 250/492.3 |
| 2003/0068566 A1 | 4/2003 | Pierrat | |
| 2004/0161675 A1 * | 8/2004 | Lin | G03F 1/30 430/5 |
| 2005/0250021 A1 | 11/2005 | Chen et al. | |
| 2013/0078746 A1 * | 3/2013 | Hotzel | G03F 7/70283 438/16 |

* cited by examiner

*Primary Examiner* — Julia Slutsker
(74) *Attorney, Agent, or Firm* — Lorenz & Kopf, LLP

(57) ABSTRACT

Methods for extreme ultraviolet (EUV) mask defect mitigation by using multi-patterning lithography techniques. In one exemplary embodiment, a method for fabricating an integrated circuit including identifying a position of a defect in a first EUV photolithographic mask, the photolithographic mask including a desired pattern and transferring the desired pattern to a photoresist material disposed on a semiconductor substrate. Transferring the desired pattern further transfers an error pattern feature to the photoresist material as a result of the defect in the first EUV photolithographic mask. The method further includes, using a second photolithographic mask, transferring a trim pattern to the photoresist material, wherein the trim pattern removes the error pattern feature from the photoresist material.

5 Claims, 5 Drawing Sheets

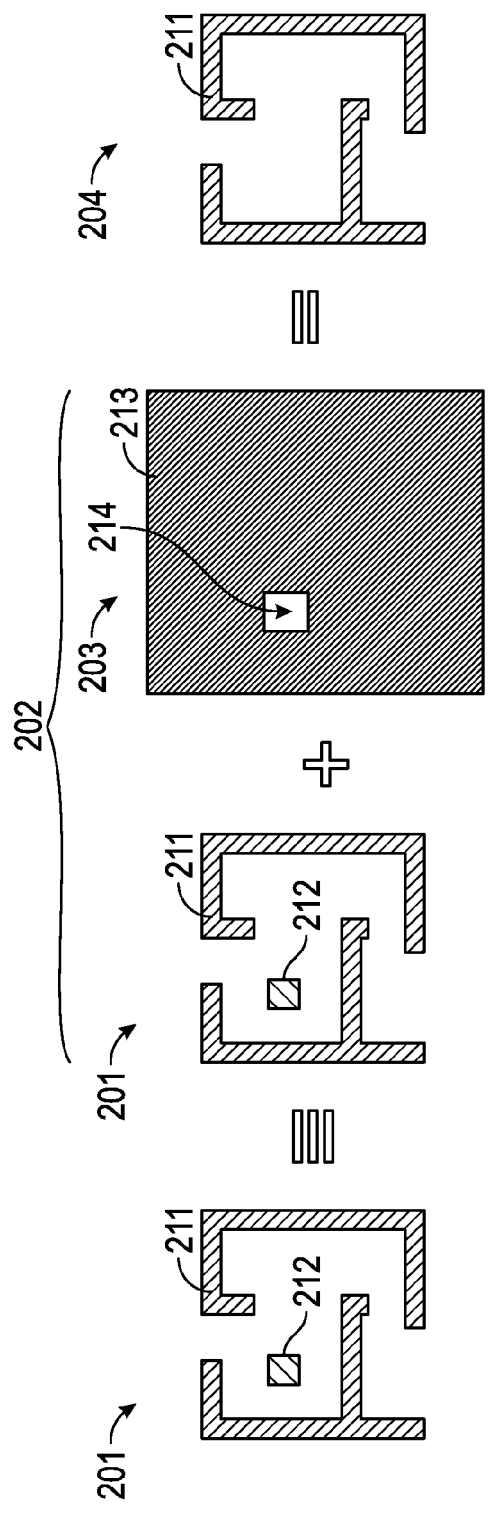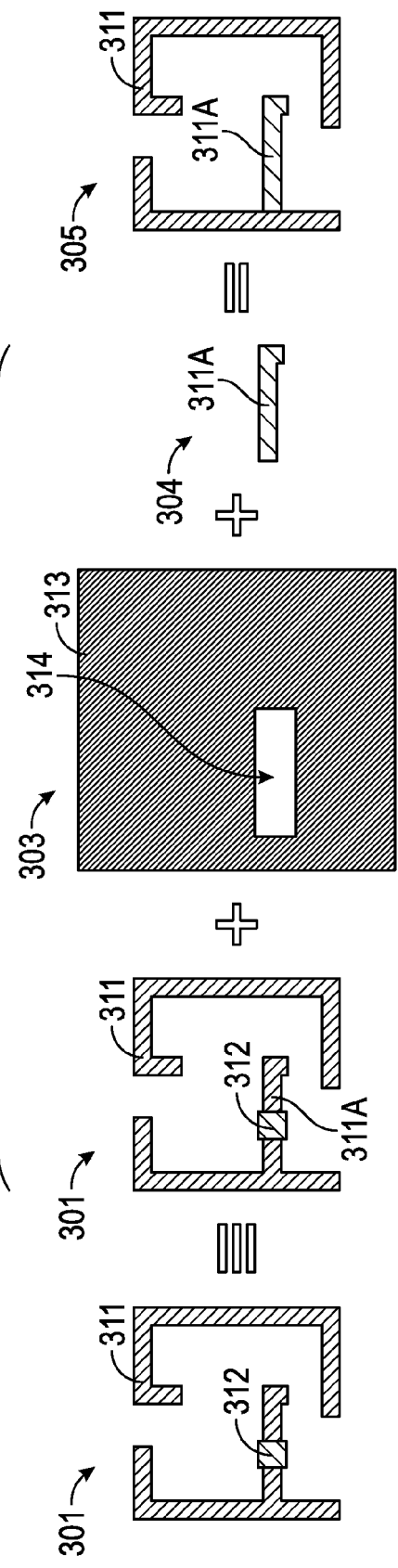

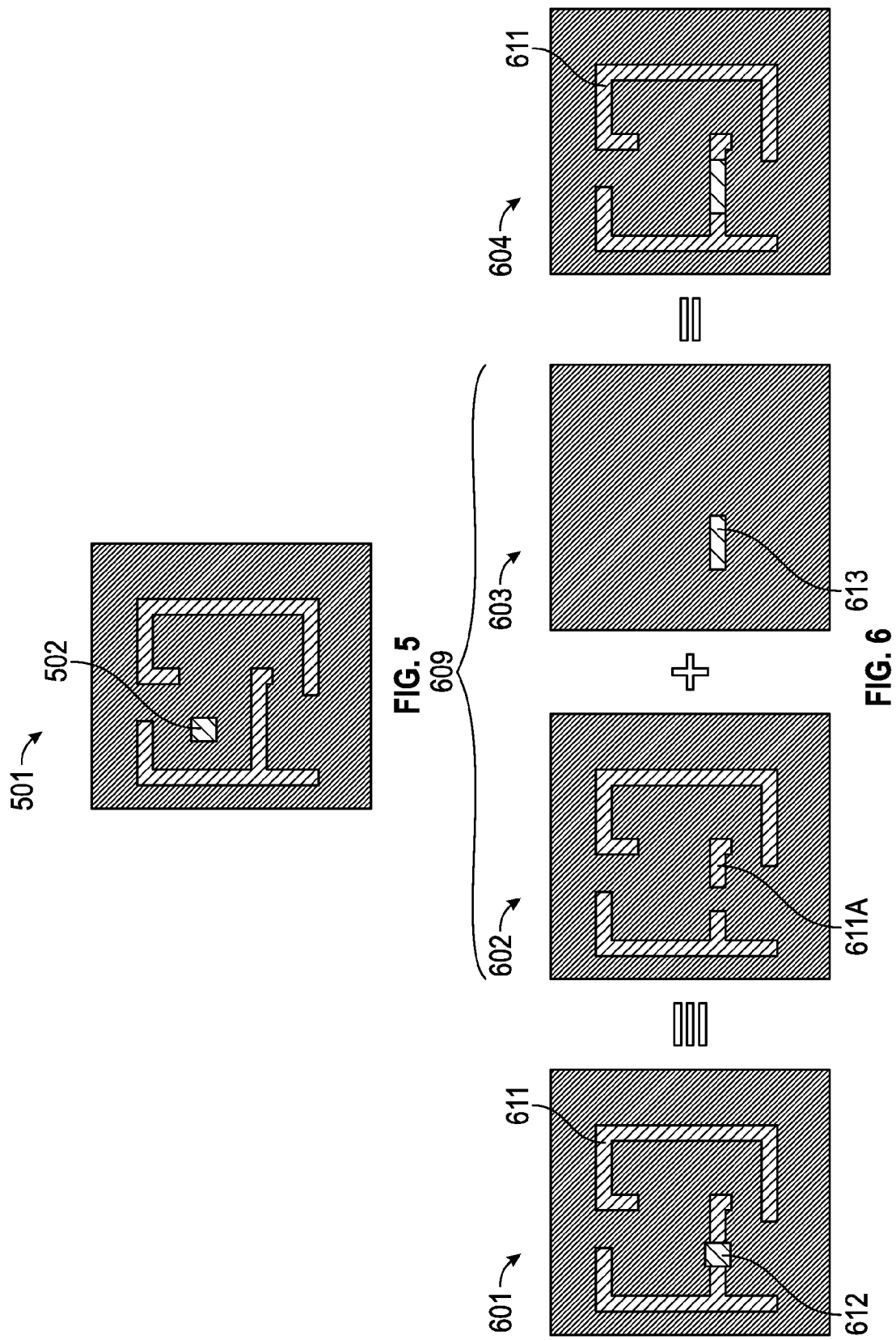

METHODS FOR EXTREME ULTRAVIOLET MASK DEFECT MITIGATION BY MULTI-PATTERNING

CROSS-REFERENCE TO RELATED APPLICATION

This application is a division of U.S. patent application Ser. No. 14/253,658, which was filed on Apr. 15, 2014, the contents of which are incorporated by reference herein in their entirety.

TECHNICAL FIELD

The present disclosure generally relates to integrated circuits and methods for fabricating integrated circuits. More particularly, the present disclosure relates to methods for fabricating integrated circuits using multi-patterning lithography techniques for extreme ultraviolet (EUV) mask defect mitigation.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

As a result of the shrinking sizes of integrated circuits, photolithographic masks project smaller and smaller structures onto a photosensitive layer, i.e., a photoresist, dispensed on a semiconductor wafer. In order to enable the decrease of the critical dimensions (CD) of the structural elements forming the integrated circuits (ICs), the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex. In the future, photolithographic masks will use even smaller wavelengths in the extreme ultraviolet (EUV) wavelength range of the electromagnetic spectrum. The term EUV mask denotes a photolithographic mask for the EUV wavelength range (for example, from about 10 nm to about 15 nm).

The optical elements for the EUV wavelength range will include reflective optical elements. For the fabrication of an EUV optical element, a multilayer structure or a multilayer film is deposited on a substrate having an ultralow thermal expansion (ULE). Fused silica is an example of a substrate used for EUV optical elements. The multilayer system may include 80 to 120 alternating layers of molybdenum (Mo) and silicon (Si). A pair of a Mo—Si layers or a Mo—Si bilayer has a depth of approximately 7 nm. At the boundary of the Mo—Si layers, a portion of the incident EUV radiation is reflected, so that a Mo—Si multilayer layer system ideally reflects more than 70% of the incident EUV radiation.

In addition to the multilayer structure, an EUV mask includes a pattern or an absorbing pattern structure on top of the multilayer. For example, the EUV radiation absorbing pattern may be formed of titanium nitride, tantalum nitride, or chromium. The interaction of the EUV radiation absorbing portions and EUV radiation reflecting portions of the EUV mask generates, in case of an illumination with EUV radiation, the pattern to be presented in the photoresist dispensed on a semiconductor wafer, such pattern thereafter being used to fabricate one or more features of the integrated circuit.

High precision is required at the fabrication of EUV optical elements, in particular for EUV masks. Errors on the order of only 1 nm may cause errors in the image of the pattern structure on the wafer. Mask errors or defects that are apparent on the pattern of the wafer generated by the mask are called printing errors. Defects of different types can occur at various positions of the EUV mask leading to various effects. Mask defects may lead to undesirable amplitude and phase errors in the fabrication of integrated circuits therefrom.

Accordingly, it is desirable to provide improved methods to counteract the undesirable effects caused by errors in EUV masks. It further is desirable to provide methods for EUV mask defect mitigation, understanding that it is not possible to eliminate all defects in an EUV mask. Furthermore, other desirable features and characteristics of the present disclosure will become apparent from the subsequent detailed description and the appended claims, taken in conjunction with the accompanying drawings and the foregoing technical field and background.

BRIEF SUMMARY

Methods for fabricating an integrated circuit using multi-patterning lithography techniques for extreme ultraviolet (EUV) mask defect mitigation are provided. In one exemplary embodiment, a method for fabricating an integrated circuit includes identifying a position of a defect in a first EUV photolithographic mask, the photolithographic mask including a desired pattern and transferring the desired pattern to a photoresist material disposed on a semiconductor substrate. Transferring the desired pattern further transfers an error pattern feature to the photoresist material as a result of the defect in the first EUV photolithographic mask. The method further includes, using a second photolithographic mask, transferring a trim pattern to the photoresist material, wherein the trim pattern removes the error pattern feature from the photoresist material.

In another exemplary embodiment, a method for fabricating an integrated circuit includes identifying a position of a defect in a first EUV photolithographic mask, the photolithographic mask including a desired pattern, data-manipulating the first photolithographic mask such that the defect is moved from patterned areas of the first photolithographic mask to unpatterned areas of the first photolithographic mask, and transferring the desired pattern to a photoresist material disposed on a semiconductor substrate. Transferring the desired pattern further transfers an error pattern feature to the photoresist material in an unpatterned area as a result of the defect in the first EUV photolithographic mask. The method further includes, using a second photolithographic mask, transferring an additional pattern to the photoresist material.

In yet another exemplary embodiment, a method for fabricating an integrated circuit includes identifying a position of a defect in a first EUV photolithographic mask, the photolithographic mask comprising a desired pattern, the first EUV photolithographic mask being complementary to a second EUV photolithographic mask for use in a multi-patterning lithography process, and data-manipulating the first photolithographic mask such that the defect is moved from patterned areas of the first photolithographic mask to unpatterned areas of the first photolithographic mask. The method further includes transferring the desired pattern to a photoresist material disposed on a semiconductor substrate, wherein transferring the desired pattern further transfers an error pattern feature to the photoresist material in an unpatterned area as a result of the defect in the first EUV photolithographic mask, and, using a third photolithographic mask, transferring an additional pattern to the photoresist material. Still further, the method includes using the second, complementary photolithographic mask, transferring a complementary pattern to the photoresist material to complete the multi-patterning lithography process.

BRIEF DESCRIPTION OF THE DRAWINGS

The present disclosure will hereinafter be described in conjunction with the following drawing figures, wherein like numerals denote like elements, and wherein:

FIGS. 2-7 illustrate methods for fabricating an integrated circuit using multi-patterning lithography techniques with photolithographic masks for EUV mask defect mitigation.

DETAILED DESCRIPTION

Figure 1B:
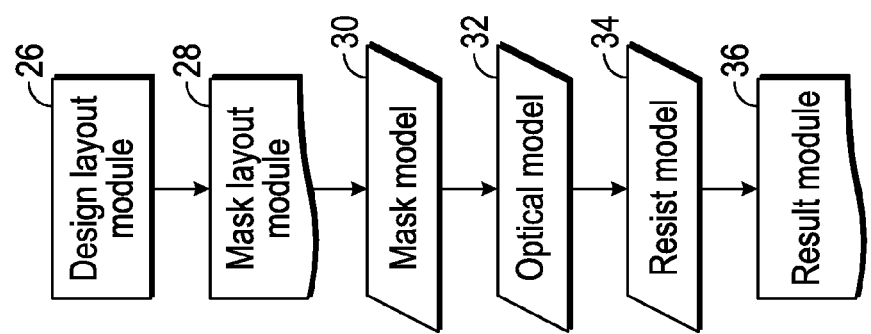
FIG. 1B illustrates separate functional modules in a lithographic projection system.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to methods for fabricating integrated circuits using multi-patterning lithography techniques for extreme ultraviolet (EUV) mask defect mitigation. In a first aspect, it will be noted that in order to enable a practical defect mitigation method, the mask blank inspection tools employed (commercially available) should be able to accurately locate defects on a blank. Once the defects are identified, in accordance with the present disclosure, data on a complementary mask of a multi-layer EUV masking system may be manipulated and compensated to remove these multilayer defects and render them non-printing by double/multi-patterning. Beneficially, the complementary mask need not be an EUV mask, and the complementary lithography step need not be EUV exposure. Rather, they may be of a lower grade/requirement, for example an opaque layer of MoSi on a glass substrate (OMOG) or a chrome on glass substrate (COG) provided for use with a 193 nm non-immersion/immersion scanner. With the presently described embodiments, there is no need for conventional computational metrology/inspection approaches or complex defect printability algorithms to mitigate EUV mask defects. Further, using the described methods, it is possible eliminate wafer loss due to EUV mask defects and improve metrology/inspection cycle times in mask shops and wafer fabrication facilities that are needed to classify printable/non-printable defects.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Prior to discussing the present embodiments, a brief discussion regarding the overall design and imaging process of EUV masks is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta max)$.

Figure 1A:
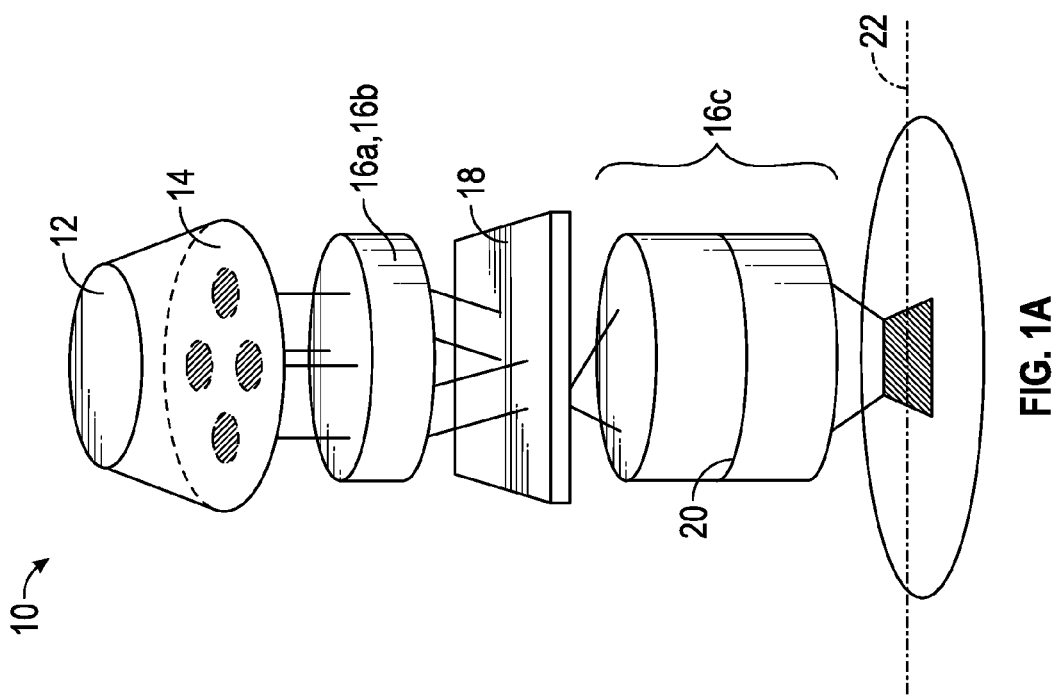
FIG. 1A illustrates an exemplary lithographic projection system.

In a lithography system, these major system components may be described by separate functional modules, for example, as illustrated in FIG. 1B. Referring to FIG. 1B, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape (e.g., off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, post-exposure bake (PEB) and development, in order to predict, for example, contours of resist features formed on the substrate wafer.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating, and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

The photolithographic masks referred to above include geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Figure 4:
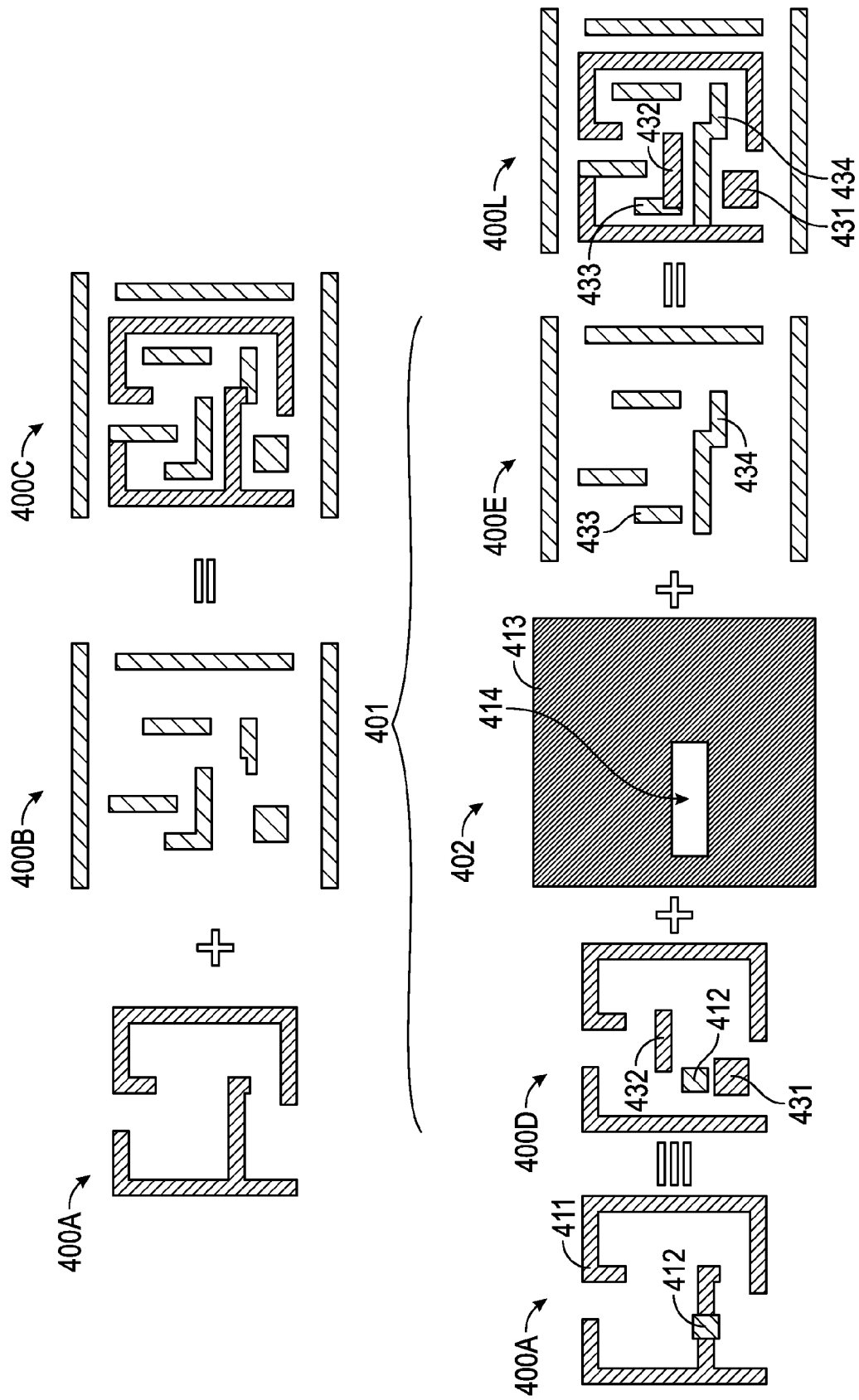
Figure 7:
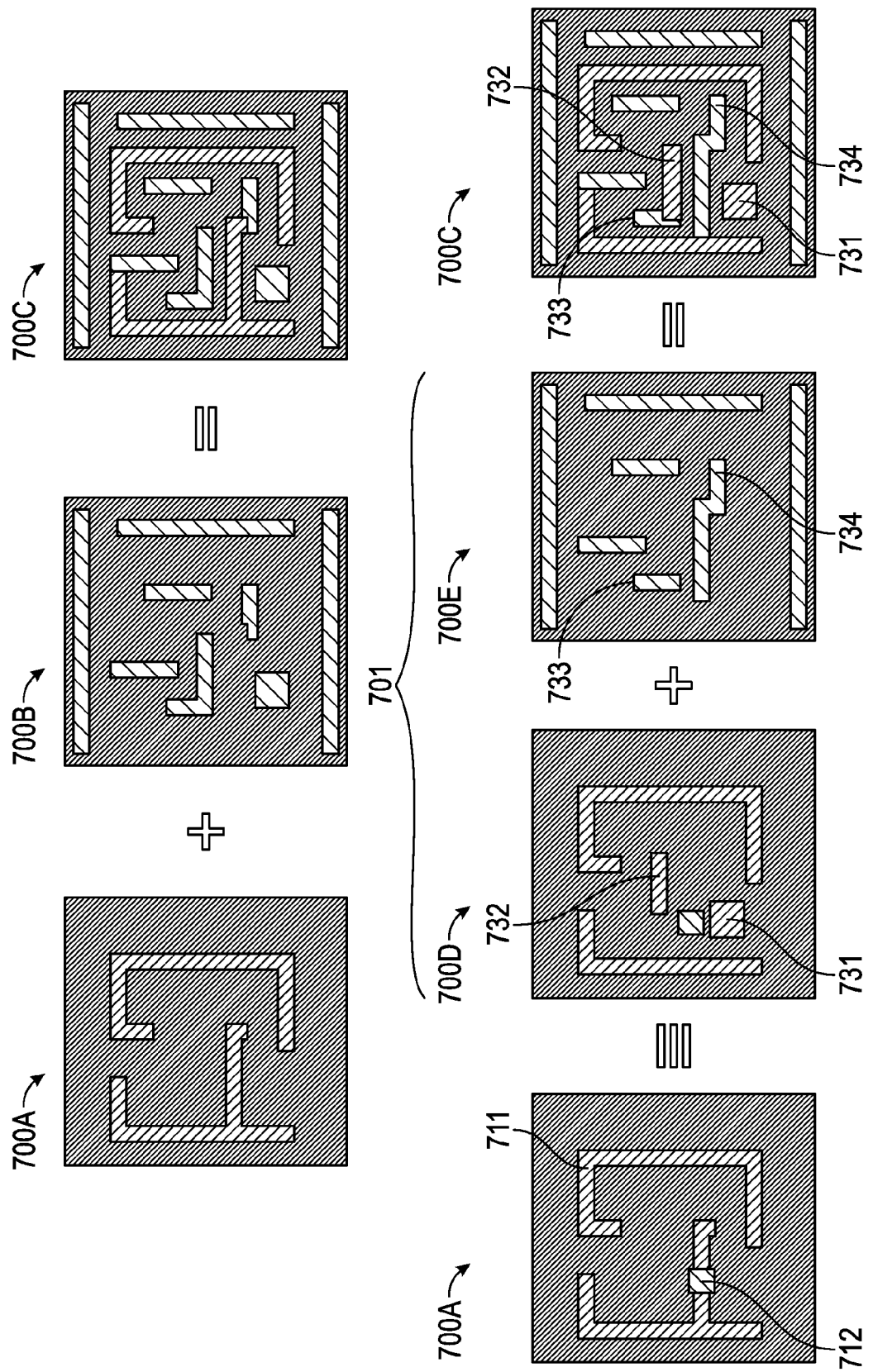

In accordance with the foregoing, FIGS. 2-7 depict photolithographic masks that may be used in connection with the presently described methods for fabricating integrated circuits using multi-patterning lithography techniques for EUV mask defect mitigation. As initially noted above, EUV lithography systems operate by using masks to direct EUV radiation onto a photoresist layer, thereby forming a pattern therein. Patterning a photoresist material is a well-known procedure that is used at various stages in the fabrication of an integrated circuit. As known by those having ordinary skill in the art, there are generally two types of photoresist material: a positive tone photoresist becomes more soluble to a developer solution upon exposure to light, whereas a negative tone photoresist becomes less soluble to a developer solution upon exposure to light. Consequently, when a negative photoresist is used, a so-called "dark field" mask is employed to transfer the appropriate pattern, thereby creating a "dark field" pattern. In contrast, when a positive tone photoresist is used, a so-called "bright field" or "clear field" mask is employed to transfer the appropriate pattern, thereby creating a "clear field" pattern. Accordingly, FIGS. 2-4 are directed to embodiments that employ bright field masks (with the "trim" masks, described below, being dark field masks), and FIGS. 5-7 are direct to embodiments that employ dark field masks (including the "trim" masks).

Referring first to FIG. 2, various EUV mask patterns are disclosed for defect mitigation in accordance with one embodiment of the present disclosure. As initially noted above, the embodiment illustrated in FIG. 2 provides a series of bright field masks. As shown in FIG. 2, a bright field mask was employed to generate a pattern 201. Pattern 201 includes a desired pattern feature 211. However, as the mask employed to form pattern 201 included a mask defect, the pattern 201 further includes an error pattern feature 212 located in an unpatterned area (i.e., an area outside of desired pattern feature 211.

In order to mitigate the effects of the mask defect, multi-patterning techniques are employed in accordance with embodiments of the present disclosure. As further shown in FIG. 2, a multi-patterning solution 202 is provided to correct the error pattern feature of pattern 201. Multi-patterning solution 202 includes both the pattern 201 (which was made by the mask including the defect) as well as a trim pattern 203 that may be provided by a trim mask. As is known in the art, a trim mask is an additional photolithographic mask that is employed to delineate/fine-tune/complete transfer of features that were not accommodated by first mask. Trim pattern 203 includes a majority blank area 213, with a small exposure area 214 provided in the area of the error pattern feature 212 (if the first mask and the trim mask were to be superimposed on one another). Thus, in practice, the substrate is first exposed to the mask that includes the defect, followed by exposure to the trim mask. This practice is represented in FIG. 2 (multi-patterning solution 202) by pattern 201 "plus" trim pattern 203. The result of such multi-patterning solution 202 is the pattern 204, which includes the desired pattern feature 211 without the error pattern feature 212.

As such, as initially noted above, it is desirable, in connection with the described embodiments, to use systems (known in the art) capable of detecting defects in an EUV mask, for example through the resulting pattern. In this manner, by accurately identifying the location of error feature 212 in pattern 201, a suitable trim mask can be designed for use in providing trim pattern 203 including an appropriately placed exposure area 214.

FIG. 3 discloses another embodiment of the present disclosure suitable for use with bright field EUV patterning masks. As shown therein, a pattern 301 is shown which, in contrast to FIG. 2, includes an error pattern feature 312 located in a patterned area, that is, overlying the desired pattern feature 311. As with the multi-patterning solution 202, multi-patterning solution 302 includes the pattern 301 and a trim pattern 303. In this example, the trim pattern 303 includes the blank area in addition to an exposure area provided to encompass an entire portion 311A of the desired pattern feature 311. In this example, the multi-patterning solution 302 further includes an additional "replacement" pattern 304 (created by an additional mask) that serves to replace the portion 311A removed by the trim pattern 303. Thus, in practice, the substrate is first exposed to the mask that includes the defect, followed by exposure to the trim mask, followed by exposure to the additional mask, which is represented in FIG. 3, as multi-patterning solution 302: pattern 301 "plus" trim pattern 303 "plus" replacement pattern 304. The result of such multi-patterning solution 302 is the pattern 305, which includes the desired pattern feature 311 without the error pattern feature 312 in portion 311A thereof.

In further embodiments of the present disclosure, also suitable for use with bright field EUV patterning masks, the multi-patterning mitigation methods disclosure above with regard to FIGS. 2 and 3 may be extended to desired patterns that themselves are formed by multi-patterning processes. For example, as shown in FIG. 4, and as is known in the art, two patterns (400A and 400B) may be combined together using successive exposures to generate a more complex pattern 400C with smaller CDs than would be possible using a single mask to create the pattern. In such processes, it will be appreciated that defects may be present in either or both of the patterning masks.

In the embodiment shown in FIG. 4, it will be assumed that a defect has been discovered in the mask for transferring pattern 400A, the defect resulting in an error pattern 412 positioned over a desired pattern feature 411. In this embodiment, the mitigation strategy includes the use of data manipulation and an additional (third) mask. In particular, data manipulation is employed to change the patterns 400A and 400B such that some pattern features originally found in pattern 400A are moved to pattern 400B, and some pattern features originally found in pattern 400B are moved to pattern 400A, with the net result of such data manipulation being the same pattern 400C after multiple patterning techniques are employed to superimposed patterns 400A and 400B. As used herein, the term "data manipulation" refers to a reconfiguration of the patters of a multiple-patterning process such that each individual pattern is different, but the resulting pattern (after multi-patterning) is the same.

Accordingly, FIG. 4 illustrates a multi-patterning solution 401 that includes a data-manipulated pattern 400D (which corresponds to pattern 400A with data manipulation to include features 431 and 432, formed by a mask having a defect), a trim pattern 402, and a data-manipulated pattern 400E (which corresponds to pattern 400B with data manipulation to include features 433 and 434). Data manipulation is done so as to move the error feature 412 from a patterned area to an unpatterned area, while still maintaining the appropriate CDs. Thus, in practice, the substrate is first exposed to the mask for data-manipulated pattern 400D that includes the defect, followed by exposure to the trim mask (including blank area 413 and trim feature 414, which is positioned so as to removed error feature 412), followed by exposure to the additional mask for data manipulated pattern 400E, which is represented in FIG. 4, as multi-patterning solution 401: pattern 400D "plus" trim pattern 402 "plus" additional pattern 400E. The result of such multi-patterning solution 401 is the pattern 400C, which does not includes the error pattern feature 412 introduced by the mask for pattern 400D.

As initially noted above, FIGS. 5-7 disclose embodiments of the present disclosure using dark field EUV masks. With particular reference to FIG. 5, if a defect is present in a dark field EUV mask in a manner such that the resulting pattern error 502 is in a non-patterned area of pattern 501, by the nature of dark field photoresist materials, the error pattern 502 does not affect the resulting pattern 501. Thus, in such cases, no defect mitigation is required.

With reference now to FIG. 6, a dark field mask embodiment is disclosed wherein the EUV mask includes a defect such that the resulting pattern includes an error feature in a patterned area. As shown therein, a pattern 601 is shown which, in contrast to FIG. 5, includes an error pattern feature 612 located in a patterned area, that is, overlying the desired pattern feature 611. A multi-patterning solution may be employed in accordance with this embodiment to mitigate the mask defect. This illustrated multi-patterning solution 609 includes a data-manipulated pattern 602 and an additional pattern 603. The data manipulated pattern 602 includes substantially desired pattern feature 611, however further including the portion 611A of the desired pattern feature being removed (i.e., replaced by a blank or non-patterned area). In this manner, by removing that portion (611A) of the pattern 611 that includes the error pattern feature 612, the error pattern feature is not patterned. In this example, the multi-patterning solution 609 further includes an additional "replacement" pattern 613 (created by an additional mask 603) that serves to replace the portion 611A removed by data manipulation from pattern 602. Thus, in practice, the substrate is first exposed to the mask that includes the defect, followed by exposure to the additional mask, which is represented in FIG. 6, as multi-patterning solution 609: pattern 602 "plus" replacement pattern 609. The result of such multi-patterning solution 609 is the pattern 604, which includes the desired pattern feature 611 without the error pattern feature 612 in portion 611A thereof.

With reference now to FIG. 7, a dark field mask embodiment is disclosed using multi-patterning techniques for forming the desired pattern, as described above in connection with FIG. 4. For example, as shown in FIG. 7, and as is known in the art, two patterns (700A and 700B) may be combined together using successive exposures to generate a more complex pattern 700C with smaller CDs than would be possible using a single mask to create the pattern. In such processes, it will be appreciated that defects may be present in either or both of the patterning masks.

Accordingly, FIG. 7 illustrates a multi-patterning solution 701 that includes a data-manipulated pattern 700D (which corresponds to pattern 700A with data manipulation to include features 731 and 732, formed by a mask having a defect), and a data-manipulated pattern 700E (which corresponds to pattern 700B with data manipulation to include features 733 and 734). Data manipulation is done so as to move the error feature 712 from a patterned area to an unpatterned area, while still maintaining the appropriate CDs. Thus, in practice, the substrate is first exposed to the mask for data-manipulated pattern 700D that includes the defect, followed by exposure to the additional mask for data manipulated pattern 700E, which is represented in FIG. 7, as multi-patterning solution 701: pattern 700D "plus" additional pattern 400E. As the error pattern feature 712 is moved to an unpatterned area of pattern 700D by data manipulation, as described above with regard to FIG. 5, the error pattern feature 712 is not printed, and thus does not affect the pattern 700E. The result of such multi-patterning solution 701 is the pattern 700C, which does not includes the error pattern feature 712 introduced by the mask for pattern 700D.

Thereafter, the integrated circuit may be complete using known process and techniques. For example, as noted above, after exposure to the EUV radiation, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. The present disclosure is not intended to exclude any such further processes as are conventional in the fabrication of conventional integrated circuits and semiconductor chips.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   identifying a position of a defect in a first EUV photolithographic mask, the first EUV photolithographic mask comprising a desired pattern, the first EUV photolithographic mask being complementary to a second EUV photolithographic mask for use in a multi-patterning lithography process;
   data-manipulating the first EUV photolithographic mask such that the defect is moved from patterned areas of the first EUV photolithographic mask to unpatterned areas of the first EUV photolithographic mask;
   transferring the desired pattern to a photoresist material disposed on a semiconductor substrate, wherein transferring the desired pattern further transfers an error pattern feature to the photoresist material in an unpatterned area as a result of the defect in the first EUV photolithographic mask;
   using a third photolithographic mask, transferring an additional pattern to the photoresist material; and
   using the second EUV photolithographic mask, transferring a complementary pattern to the photoresist material to complete the multi-patterning lithography process.

2. The method of claim 1, wherein using the third photolithographic mask comprises using either an EUV photolithographic mask or a 193 nm UV photolithographic mask.

3. The method of claim 1, wherein transferring the desired pattern to the photoresist material comprises transferring the desired pattern to either a positive tone photoresist material or a negative tone photoresist material.

4. The method of claim 1, further comprising, subsequent to using the second EUV photolithographic mask, developing the photoresist material.

5. The method of claim 4, further comprising, subsequent to developing the photoresist material, forming an integrated circuit structure on the semiconductor substrate.

* * * * *